US 11,254,260 B2

(12) United States Patent
Deichsel et al.

(10) Patent No.: US 11,254,260 B2
(45) Date of Patent: Feb. 22, 2022

(54) METHOD FOR TRAILER LIGHTING RECOGNITION

(71) Applicant: HELLA GMBH & CO. KGAA, Lippstadt (DE)

(72) Inventors: Matthias Deichsel, Minden (DE); Jan Schmaeling, Bad Brueckenau (DE); Felix Caesar, Unterpleichfeld (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 17/135,908

(22) Filed: Dec. 28, 2020

(65) Prior Publication Data

US 2021/0129746 A1    May 6, 2021

Related U.S. Application Data

(63) Continuation of application No. PCT/EP2019/065867, filed on Jun. 17, 2019.

(30) Foreign Application Priority Data

Jun. 25, 2018  (DE) ............... 10 2018 115 178.0

(51) Int. Cl.
*B60Q 1/30* (2006.01)
*H05B 45/14* (2020.01)
*H05B 45/50* (2020.01)

(52) U.S. Cl.
CPC ............ *B60Q 1/305* (2013.01); *H05B 45/14* (2020.01); *H05B 45/50* (2020.01)

(58) Field of Classification Search
CPC ........ H05B 45/14; H05B 45/50; H05B 47/22; B60Q 1/305; B60Q 11/005; B60T 7/20; B60R 16/00; F21K 9/00; F21K 9/20
See application file for complete search history.

(56) References Cited

U.S. PATENT DOCUMENTS

| 6,490,512 | B1 | 12/2002 | Niggemann | |
|---|---|---|---|---|
| 7,746,219 | B1 * | 6/2010 | Paul | B60D 1/64 340/431 |
| 9,817,049 | B2 | 11/2017 | Dome et al. | |

(Continued)

FOREIGN PATENT DOCUMENTS

| CN | 109076666 A * | 12/2018 | ............ B60Q 11/00 |
|---|---|---|---|
| DE | 198 52 351 A1 | 5/2000 | |

(Continued)

OTHER PUBLICATIONS

Frank et al., DE 102007012913 A1, Sep. 25, 2008 (Year: 2008).*

*Primary Examiner* — Abdullah A Riyami
*Assistant Examiner* — Syed M Kaiser
(74) *Attorney, Agent, or Firm* — Muncy, Geissler, Olds & Lowe, P.C.

(57) ABSTRACT

A method for trailer lighting recognition by a control unit for trailer lighting control of a towing vehicle, in particular for trailer lighting recognition during or after the coupling of the trailer to the towing vehicle, wherein the control unit has, for each light of the trailer lighting system, a voltage supply connection that is connected by an actuator to a voltage supply of the towing vehicle in order to switch on the light of the trailer associated with the voltage supply connection.

9 Claims, 2 Drawing Sheets

(56) References Cited

U.S. PATENT DOCUMENTS

| | | | |
|---|---|---|---|
| 2010/0308984 A1* | 12/2010 | Ehrlich | B60Q 1/0088 |
| | | | 340/431 |
| 2012/0081014 A1* | 4/2012 | Blanchard | H05B 45/50 |
| | | | 315/185 R |
| 2018/0009377 A1* | 1/2018 | Troutman | B60Q 11/005 |

FOREIGN PATENT DOCUMENTS

| | | |
|---|---|---|
| DE | 20 2007 007 776 U1 | 9/2007 |
| DE | 10 2007 012 913 A1 | 9/2008 |
| DE | 10 2008 044 666 A1 | 3/2010 |
| DE | 20 2010 005 779 U1 | 9/2010 |
| DE | 10 2010 038 157 A1 | 4/2012 |
| DE | 10 2013 103 307 A1 | 10/2014 |
| DE | 10 2016 221 695 A1 | 5/2018 |
| WO | WO 2014/161871 A1 | 10/2014 |
| WO | WO-2020002025 A1 * 1/2020 ............. H05B 45/14 |  |

* cited by examiner

METHOD FOR TRAILER LIGHTING RECOGNITION

This nonprovisional application is a continuation of International Application No. PCT/EP2019/065867, which was filed on Jun. 17, 2019, and which claims priority to German Patent Application No. 10 2018 115 178.0, which was filed in Germany on Jun. 25, 2018, and which are both herein incorporated by reference.

BACKGROUND OF THE INVENTION

Field of the Invention

The present invention relates to a method for trailer lighting recognition by a control unit for trailer lighting control of a towing vehicle, in particular for trailer lighting recognition during or after the coupling of the trailer to the towing vehicle, wherein the control unit has, for each light of the trailer lighting system, a voltage supply connection that is connected by an actuator to a voltage supply of the towing vehicle in order to switch on the light of the trailer associated with the voltage supply connection.

A device with which the recognition of a trailer during coupling is possible is known from the document DE 10 2013 103 307 A1, which corresponds to U.S. Pat. No. 9,817,049, which is incorporated herein by reference.

Description of the Background Art

The multiplicity of possible embodiments for a trailer lighting system currently represents a special challenge for monitoring of a trailer lighting system. Thus, it is possible that the various lights of a trailer, namely the brake light, the right taillight, the left taillight, the right turn signal light (right blinker), the left turn signal light (left blinker), optionally the rear fog light, and optionally the backup light, have different lamps for producing light. Thus, lights with one or more incandescent bulbs, LED lights with one function, LED lights with more than one function (also called combination lights), and even, in the case of blinkers, so-called lights with ISO pulse, can be used, where the latter have internal monitoring that reports fault-free functioning to the control unit by means of a pulse sent through the voltage supply line.

LED lights with one function are LED lights that are connected to only one voltage supply connection and function only as a brake light, as a right taillight, as a left taillight, as a backup light, or as a rear fog light, for example.

In contrast, LED lights with more than one function (combination lights) are connected to multiple voltage supply connections, and they light up as soon as a supply voltage is applied to one of the voltage supply connections. The LED lights with multiple functions light up differently, for example brighter or dimmer at times, as a function of the particular supply connections connected to the light to which the voltage is applied. This can be achieved by the means that the LEDs are connected to the supply connections through dropping resistors having different values, and currents of different magnitudes flow through the supply connections to the LEDs as a function thereof.

Now, if the desire is to monitor the switched-on lights of a trailer during ongoing operation from the towing vehicle or using the control unit of the towing vehicle, then it must be possible to individually monitor the functions of the LED lights with multiple functions. This means that only one function of the LED lights with multiple functions may be activated, at least for the moment of the monitoring. The LED light with multiple functions may then be supplied with voltage through only one voltage supply connection.

In order for all voltage supply connections to be switched off except for the one to be checked in an LED light with multiple functions, the towing vehicle or its control unit must be informed as to which of the trailer's LED lights is an LED light with multiple functions and which functions this LED light can perform. This could, in principle, be accomplished by a user input if the towing vehicle or the control unit were set up for this. However, this would be inconvenient and error-prone, since the user can forget to make the entry or do it incorrectly.

SUMMARY OF THE INVENTION

It is therefore an object of the present invention to provide a method with which it can be discovered by the control unit as early as coupling of the trailer whether or not an LED light of the trailer is a light with multiple functions, and which functions it has, if applicable. The invention proposes that lights with one or more incandescent bulbs, LED lights with one function, and/or LED lights with two or more functions are recognized by the control unit.

According to the invention, it is possible that a trailer light with one or more incandescent bulbs is recognized by the means that, first of all, a voltage supply of a light is switched on. The switched-on light is then recognized as a light with one or more incandescent bulbs if a load current exceeding a predetermined first current value is driven by the switched-on voltage supply through the voltage supply connection to which the switched-on light is connected. In contrast, the light is recognized as an LED light with one function or as an LED light with two or more functions if the load current is less than the predetermined first current value. Preferably, a value that lies between the characteristic currents drawn by an incandescent light on the one hand and an LED light on the other hand is taken as the first current value. The first current value can correspond to the so-called inrush current of incandescent bulbs, for example.

Distinguishing between an incandescent light and an LED light does not suffice on its own for optimal light monitoring. For this purpose, it is also necessary to distinguish between an LED light with one function and an LED light with two or more functions. An LED light with two or more functions can be recognized by the means that the voltage supply of a light that could be an LED light with one function or an LED light with two or more functions is switched on. The switched-on light remains switched on while the results of current measurements of second currents on current paths from the control unit to the switched-off lights of the trailer are then checked sequentially. For this purpose, the measurements are carried out in the current paths that pass through the voltage supply connections of the lights that are not switched on. These current measurements of the second currents can be carried out by means of current measurement circuits. The current measurement circuits can each have a measurement resistor through which are passed the second currents that pass through the current paths to the lights that are not switched on. If either no current or a current that is less than a second current value flows through one of the current paths whose second currents are measured, the switched-on LED light is an LED light with two or more functions. If, in contrast, the measured second current is above the second current value, an additional check is necessary.

A check is then made as to whether a difference between a stored reference current for this light that is not switched on and the measured second current is below a reference difference. If this is the case, the switched-on LED light is an LED light with only one function; in contrast, if the difference is larger, an LED light with multiple functions is recognized.

It is possible according to the invention that the measurement resistors of the current measurement circuits for measuring the second currents, or the current paths in which the second currents are measured, have a higher ohmic resistance than the current path through which the switched-on light is supplied.

Advantageously, the load current for supplying the switched-on light is greater than the second current.

When a method according to the invention is carried out, a first loop can be executed multiple times. At each execution of the first loop, a check can be made for a trailer light as to what kind of a light it is. In the first loop of the method, the voltage supply of the trailer light to be recognized is switched on and the abovementioned steps for recognition of the switched-on light are carried out. The voltage supply is switched off again once the recognition of the lights with one or more incandescent bulbs, LED lights with one function, and/or LED lights with two or more functions has concluded. Then the first loop is executed again and a second light is switched on. After this light's type has also been identified, execution of the first loop is repeated until the type of all trailer lights has been recognized.

In a second loop of the method, which can be executed multiple times within each execution of the first loop, a check can be carried out, in particular when an LED light has been recognized, as to whether the switched-on light is an LED light with one function or an LED light with two or more functions. At each execution of the second loop, the second current can be measured in a different current path leading to a light that is not switched on.

Finally, it is possible within the first loop to query within the control unit whether or not an LED light is a turn signal light. In the case that the LED light is a turn signal light, it is possible to check whether or not the turn signal light cyclically sends a pulse that confirms fault-free functioning of the light. From this so-called ISO pulse, it is possible to recognize whether or not the LED turn signal light has internal monitoring.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
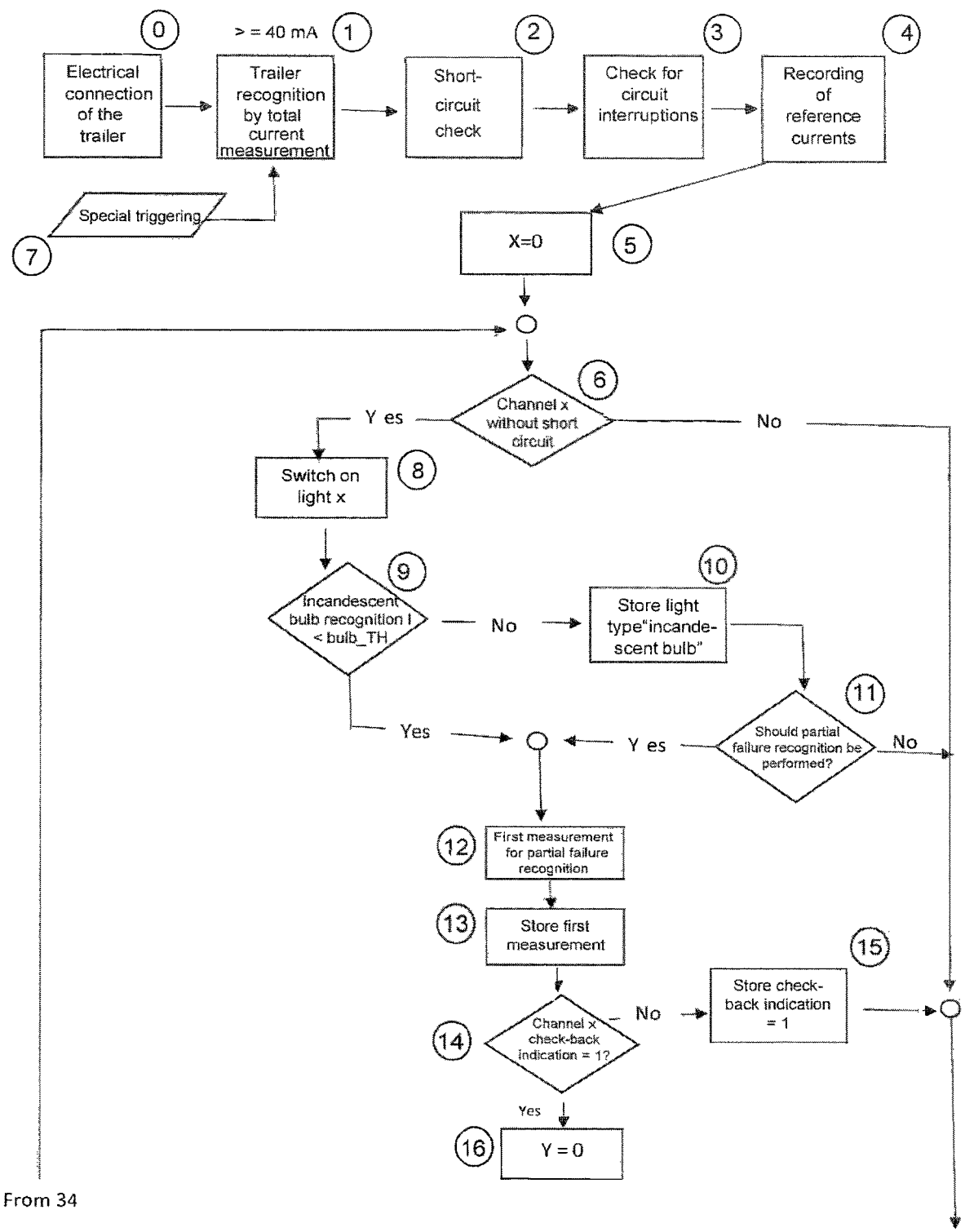
FIGS. 1a and 1b show a flowchart of a method according to the invention.
Figure 1B:
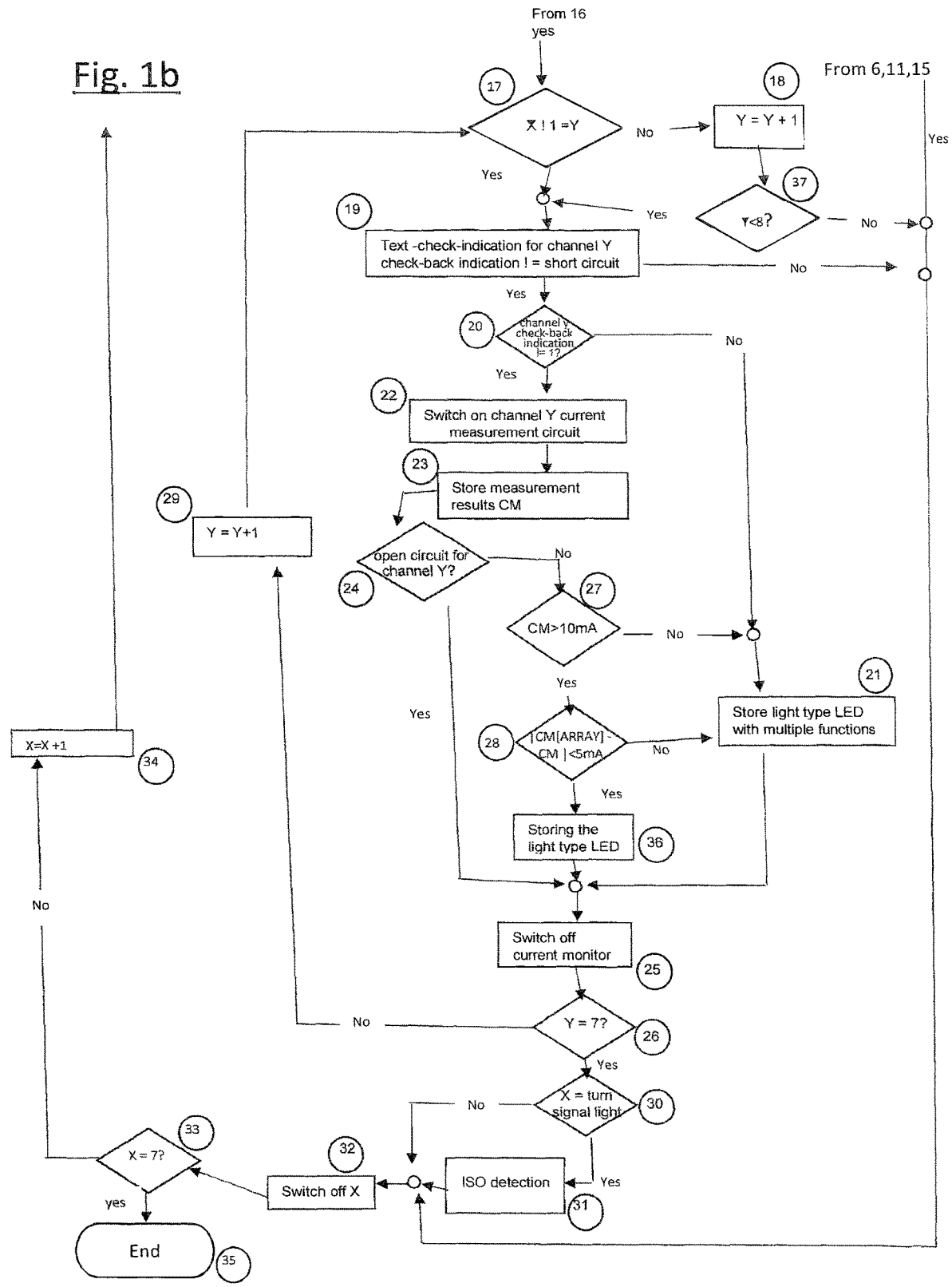

The method according to the invention shown in the flowchart is initiated by the coupling of a trailer to a towing vehicle, namely the electrical connection 0 of the trailer's lighting system to the towing vehicle's control unit for lighting of the trailer. An initiation can also be caused by the unlocking of the towing vehicle. This is necessary or useful when monitoring of whether or not a trailer is electrically connected to the towing vehicle is not carried out in an idle state of the vehicle, which is to say when a vehicle is locked. If the trailer is connected in the idle state, the monitoring is specially triggered by the unlocking or by another trigger (step 7).

Then the control unit first carries out a total current measurement (step 1) that is known per se, by which means it is detected that a trailer is electrically connected to the towing vehicle. The electrical connection is accomplished using plug- and socket connectors, preferably using known, standard 13-pin connectors conforming to ISO 11446. Connections using other plug- and socket connectors that meet applicable national regulations are also possible, however.

In a next step 2, a check is made for the supply connections as to whether a short circuit exists to the positive potential ("steady plus") of the electrical system of the towing vehicle (short-to-plus detection). The result of this short-circuit check is temporarily stored in a memory.

Then in the following step, a check is made as to whether one of the circuits through one of the supply connections is interrupted (open load detection). For this purpose, a current is produced with a high-resistance current measurement circuit (current monitor), and a (second) current is driven through each of the supply connections. The currents that arise are measured (step 3), and stored as reference currents (step 4).

Next, a light counter x is initialized (step 5), and a first loop 6 to 34, 36 is entered. One of the supply connections is checked in detail in each pass through the first loop 6 to 34, 36.

In the first check (step 6), the result of the short-circuit check (step 2) is retrieved from the memory. If a short circuit was present, most further steps 7 to 31, 36 of the first loop 6 to 34, 36 are skipped. At the end of the first loop 6 to 34, 36, if the voltage supply of the supply connection had been switched on, the voltage supply of the supply connection is switched off (step 32), and the method proceeds to the next supply connection to be checked (step 34), which is symbolized in the flowchart by the entry "x=x+1".

If the retrieval from the memory (step 6) of the result of the short-circuit check (step 2) shows that no short circuit to the positive potential of the vehicle electrical system was present, further steps of the first loop are executed.

In this case, the voltage supply of the supply connection to be checked is first switched on (step 8).

Then a check takes place (step 9) as to whether or not the trailer light connected to the supply connection is an incandescent light. For this purpose, a check is made as to whether or not the current through the supply connection is less than a characteristic threshold value (first current value). If this is not the case, which is to say if the current is greater than or equal to the first current value, it is assumed that an incandescent light is connected to the supply connection. This result is stored in the memory 10. The type of light connected to the supply connection is thus recognized and stored.

If the light is an incandescent light, the possibility exists in the described method according to the invention to determine characteristic values of the incandescent light that can be used during ongoing operation for a partial failure recognition of the trailer lighting system or for a failure of the incandescent light. Consequently, a check is made in step 11 as to whether values for a partial failure recognition should be determined (step 11). If this is not the case, and if the lights at all supply connections have not been checked, the voltage at the supply connection is switched off and the method proceeds to the next supply connection to be checked, which is symbolized in the flowchart by the entry "x=x+1" (step 34), as already mentioned.

In contrast, if the result after the measurement of the current through the supply connection (step 9) is that the current is less than the first current value, then no incandescent light is connected at this supply connection. If no incandescent light is connected and if characteristic values are to be determined for a partial failure recognition in the case of a connected incandescent light, a measured value (step 12) of the current flowing through the supply connection is stored in the memory (step 13).

Next, a check-back output of a driver for the current flowing through the supply connection can also be queried in the step, at which it is possible to recognize whether current is flowing through the output of the driver. If the check-back output indicates a driver fault (step 14), this is also stored in the memory (step 15), and if the lights at all supply connections have not been checked, the voltage at the supply connection is switched off 33 in order to proceed to the next supply connection to be checked (step 34).

In contrast, if the check-back output of the driver indicates no driver fault, a second loop 17 to 29 is entered, which is processed multiple times within the first loop 6 to 34 if necessary, namely once for each supply connection y that is not switched on. The switched-on supply connection x is skipped (steps 17, 18). At each pass of the second loop, a supply connection y that is not switched on is checked. In order to prevent the counter y from being increased to a value above seven in a last execution of the first loop at X=7, a special exit condition for exiting from the first and second loops is defined in step 37.

After entry into the second loop 17 to 29, a check is made 19 by readout from the memory as to whether a short circuit was detected during the short-circuit check 2 for the supply connection y to be checked. If this is the case, the second loop is exited and the method branches to step 32 in the first loop.

Then a check is made 20 as to whether the check-back connection of the driver of the switched-off supply connection y to be checked indicates a voltage at the output of the driver. If this is the case, it is assumed that the indicated voltage is an effect of the switched-on supply connection x on the supply connection y that is not switched on. This effect is present in LED lights with two or more functions, but not in LED lights with only one function. An LED light with multiple functions (combination light, step 21) is connected at the supply connection x as well as at the supply connection y. The current monitor to the supply connection y is then switched off (step 25).

Even when no voltage is present at the check-back connection, a combination light may be present. Consequently, during the further execution of the second loop 17 to 29, a current is sent 22 through the supply connection y by the higher-resistance current monitor of the control unit, a process that is known per se from the documents DE 10 2013 103 307 A1 and WO 2014/161871 A1. A measured value (readback value) for the current pulse is acquired, and is stored in the memory 23.

A query 24 then takes place as to whether or not the circuit through the supply connection y to be checked that is not switched on is interrupted; this was acquired in step 3.

If this is the case, then it is not possible that the switched-on supply connection x is connected to an LED light with multiple functions that can also be supplied through the supply connection y that is not switched on. The current monitor for the supply connection y is then switched off 25. Then either an additional execution of the second loop 17 to 29 with an incrementation of y is continued or execution in the first loop 6 to 34 continues with step 29, depending on whether or not the checked supply connection y that is not switched on is the last supply connection to be checked that is not switched on 26.

If the result of the query 24 is that the circuit through the supply connection y to be checked that is not switched on is not interrupted, the last second current value measured by the current monitor and stored (see steps 22, 23) is compared (step 27) with a reference current value. If the second current value is less than the reference current value, the light connected to the switched-on power supply connection is recognized as an LED light with multiple functions (step 21). Next, the current monitor for the checked light y is switched off (step 25).

If, in contrast, the second current value is greater than the reference current value of, for example, 10 mA, an additional check is necessary. For this purpose, a difference between the second current value stored in step 4 and the second current value stored in step 23 is calculated. If the amount of the difference is greater (step 28) than a reference difference of, for example, 5 mA, then experience says that an interaction is present between the supply connection x and the supply connection y, and the same combination light is connected to both (step 21). If, in contrast, the difference is smaller, then, after the information that the LED is a light with only one function has been stored for the LED light in the memory in step 36, a check is made in step 26 as to whether all lights that are not switched on have been checked (step 26). If this is the case, the second loop is exited.

Once the second loop 17 to 29 has been executed for all supply connections that are not switched on, a check takes place (step 30) as to whether a turn signal light (blinker) is connected to the supply connection x. If this is the case, a check is made in step 31 as to whether or not the blinker sends an ISO pulse. Either next or immediately after step 32, the method continues with switching off the checked light. This is followed by the check (step 33) as to whether or not a determination of the light type has taken place for all supply connections. If so, the method is concluded (step 35). In contrast, if light types are still unknown, x is incremented in step 34 and the first loop is executed again.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for trailer lighting recognition by a control unit for trailer lighting control of a towing vehicle during or after the coupling of a trailer to the towing vehicle, the method comprising:
   providing for the control, for each light of a trailer lighting system, a voltage supply connection that is connected by an actuator to a voltage supply of the towing vehicle in order to switch on the light of the trailer associated with the voltage supply connection; and recognizing, via the control unit, lights with one or more incandescent bulbs, LED lights with one function, and/or LED lights with two or more functions, wherein an LED light with one function or an LED light with two or more functions is recognized in that the voltage supply is switched on of a light that is then recognized as the LED light with one function or as the LED light with two or more functions when a load current of the light driven by the switched-on voltage supply falls below the predetermined first current value, wherein the LED light with two or more functions is recognized in that the voltage supply of a light recognized as the LED light with one function or as the LED light with two or more functions is switched on, which light is then recognized as the LED light with two or more functions when a current measurement in a current path through the voltage supply connection associated with a light different from the switched-on light yields a second current that is less than a second current value.

2. The method according to claim 1, wherein a light with one or more incandescent bulbs is recognized in that the voltage supply is switched on of a light that is then recognized as the light with one or more incandescent bulbs when the load current of the light driven by the switched-on voltage supply through the voltage supply connection associated with the switched-on light exceeds a predetermined first current value.

3. The method according to claim 1, wherein the LED light with one function is recognized by the means that the voltage supply of a light recognized as the LED light with one function or as the LED light with two or more functions is switched on, which light is then recognized as the LED light with two or more functions when a current measurement in a current path through the voltage supply connection associated with a light different from the switched-on light yields the second current that is greater than the second current value, and an amount of a difference between the measured current value and a stored reference current value is greater than a reference difference.

4. The method according to claim 1, wherein the LED light with one function is recognized by the means that the voltage supply of a light recognized as the LED light with one function or as the LED light with two or more functions is switched on, which light is then recognized as the LED light with one function when a current measurement in a current path through the voltage supply connection associated with a light different from the switched-on light yields the second current that is less than the second current value and the amount of the difference between the measured current value and a stored reference current value is greater than a reference difference.

5. The method according to claim 1, wherein the current path in which the second current is measured has a higher ohmic resistance than the current path through which the switched-on light is supplied.

6. The method according to claim 1, wherein the load current for supplying the switched-on light is greater than the second current.

7. The method according to claim 1, wherein, in a first loop of the method, the voltage supply of the trailer light to be recognized is switched on and the voltage supply is switched off again once the recognition of the lights with one or more incandescent bulbs, the LED lights with one function, and/or the LED lights with two or more functions has concluded, and in that this first loop is executed once for each light of the trailer.

8. A method for trailer lighting recognition by a control unit for trailer lighting control of a towing vehicle during or after the coupling of a trailer to the towing vehicle, the method comprising:

providing for the control, for each light of a trailer lighting system, a voltage supply connection that is connected by an actuator to a voltage supply of the towing vehicle in order to switch on the light of the trailer associated with the voltage supply connection; and recognizing, via the control unit, lights with one or more incandescent bulbs, LED lights with one function, and/or LED lights with two or more functions, wherein, in a first loop of the method, the voltage supply of the trailer light to be recognized is switched on and the voltage supply is switched off again once the recognition of the lights with one or more incandescent bulbs, the LED lights with one function, and/or the LED lights with two or more functions has concluded, and in that this first loop is executed once for each light of the trailer, wherein, within the first loop, in order to distinguish whether a switched-on light is the LED light with one function or the LED light with two or more functions, a second loop of the method is executed for each light that is not switched on, wherein a check is carried out within the second loop, and wherein, at each execution of the second loop, a current is measured in a different current path that passes through one of the switched-off lights.

9. The method according to claim 8, wherein, within the first loop after the second loop has been exited, a check is carried out as to whether or not the LED light is a turn signal light, and wherein, in the case that the LED light is a turn signal light, a check is carried out as to whether the turn signal light cyclically sends a pulse that confirms fault-free functioning of the light.

* * * * *